(12) United States Patent
Usui et al.

(10) Patent No.: US 6,995,434 B2
(45) Date of Patent: Feb. 7, 2006

(54) SEMICONDUCTOR DEVICE AND METHOD OF FABRICATING THE SAME

(75) Inventors: Ryosuke Usui, Ichinomiya (JP); Kazuhiro Sasada, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/671,458

(22) Filed: Sep. 29, 2003

(65) Prior Publication Data

US 2004/0150048 A1    Aug. 5, 2004

(30) Foreign Application Priority Data

Sep. 30, 2002  (JP)  .............................. 2002-287305

(51) Int. Cl.
  *H01L 29/76*  (2006.01)
  *H01L 29/94*  (2006.01)
  *H01L 31/062*  (2006.01)
  *H01L 31/119*  (2006.01)

(52) U.S. Cl. ..................... 257/368; 257/386; 257/407
(58) Field of Classification Search ................ 257/368, 257/386, 407
See application file for complete search history.

(56) References Cited

U.S. PATENT DOCUMENTS 6,703,672 B1 *   3/2004   Brigham et al. ............ 257/407

FOREIGN PATENT DOCUMENTS

| JP | 05-48098 | 2/1993 |
| JP | P2000-22150 A | 1/2000 |

* cited by examiner

*Primary Examiner*—Long Pham
(74) *Attorney, Agent, or Firm*—McDermott Will & Emery LLP

(57) ABSTRACT

A semiconductor device capable of suppressing increase of the capacitance while suppressing a thin-line effect of a silicide film is obtained. This semiconductor device comprises a first silicon layer formed on a semiconductor substrate through a gate insulator film with an upper portion and a lower portion larger in width than a central portion for serving as a gate electrode and a first silicide film formed on the first silicon layer for serving as the gate electrode.

17 Claims, 6 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, it relates to a semiconductor device including a gate electrode having a silicide film and a method of fabricating the same.

2. Description of the Background Art

In general, elements are increasingly refined, improved in density, increased in speed and reduced in power consumption in the field of LSIs (large-scale integrated circuits).

In order to refine an element, it is necessary to reduce the resistance values of a gate electrode and source/drain regions of a MOS transistor and a wire for inhibiting the resistance values from increase following the refinement. A method of forming a silicide film on a polysilicon layer constituting the gate electrode and the wire as well as the source/drain regions formed on a silicon substrate is known as one of methods of reducing the resistance values of the gate electrode, the source/drain regions and the wire. The resistance values of the gate electrode and the wire consisting of polysilicon and the source/drain regions formed on the silicon substrate can be reduced due to the silicide, which is a compound of silicon and a metal having a lower resistance value than silicon.

A salicide (self-aligned silicide) process of forming a silicide film on a polysilicon layer constituting a gate electrode and source/drain regions located on the surface of a silicon substrate in a self-aligned manner has generally been developed as a method of forming a silicide film. This salicide process is disclosed in Japanese Patent Laying-Open No. 2000-22150, for example. According to this salicide process capable of silicifying the gate electrode and the source/drain regions through the same step, the number of fabrication steps and the fabrication cost can be reduced. Therefore, the salicide process is widely employed for a process of fabricating a MOS transistor.

In a structure including a MOS transistor formed through the aforementioned salicide process, the resistance can be reduced due to the silicide film and hence the resistance can be inhibited from increase also when the MOS transistor is refined. When the MOS transistor is refined, however, the distance between the gate electrode and a wire adjacent thereto is reduced to disadvantageously increase the capacitance between the gate electrode and the wire. If the center distance between the gate electrode and the wire remains intact, the capacitance therebetween can be reduced by reducing the line widths of the gate electrode and the wire thereby increasing the distance between the side surfaces of the gate electrode and the wire. If the line widths of the gate electrode and the wire are excessively reduced, however, the width of the silicide film is also excessively reduced to disadvantageously abruptly increase the resistance due to a thin-line effect of the silicide film.

SUMMARY OF THE INVENTION

An object of the present invention is to provide a semiconductor device capable of suppressing increase of a capacitance while suppressing a thin-line effect of a silicide film.

Another object of the present invention is to provide a method of fabricating a semiconductor device capable of suppressing increase of a capacitance while suppressing a thin-line effect of a silicide film.

In order to attain the aforementioned objects, a semiconductor device according to a first aspect of the present invention comprises a first silicon layer formed on a semiconductor substrate through a gate insulator film with an upper portion and a lower portion larger in width than a central portion for serving as a gate electrode and a first silicide film formed on the first silicon layer for serving as the gate electrode.

In the semiconductor device according to the first aspect, as hereinabove described, the first silicon layer serving as the gate electrode is formed with the upper and lower portions larger in width than the central portion so that the distance between the central portion of the gate electrode and an adjacent wire is increased due to the central portion having a small width, whereby the capacitance between the gate electrode and the wire can be reduced. The central portion has a smaller width than the upper portion so that the width of the upper portion (upper surface) is prevented from reduction also when the width of the central portion is reduced for reducing the capacitance. Thus, the first silicide film formed on the first silicon layer can be prevented from reduction of the width, whereby a thin-line effect of the silicide film can be reduced. Consequently, it is possible to inhibit the capacitance from increase while suppressing the thin-line effect of the silicide film. The gate electrode is formed with the upper and lower portions larger in width than the central portion so that the upper and lower portions of the first silicon layer serve as mask portions when ions are implanted through the gate electrode serving as a mask, whereby a region of the semiconductor substrate located under the gate electrode can be further inhibited from ion implantation of an impurity as compared with a case where only the upper portion of the first silicon layer serves as a mask. Thus, controllability for the ion implantation profile can be improved.

In the aforementioned semiconductor device according to the first aspect, the first silicon layer serving as the gate electrode preferably includes the upper portion having a reverse mesa shape and the lower portion having a forward mesa shape. The shape having the reverse mesa upper portion and the forward mesa lower portion can be easily formed through etching, whereby the gate electrode having the upper portion and the lower portion larger in width than the central portion can be easily formed.

In the aforementioned semiconductor device according to the first aspect, the first silicon layer preferably includes a lower layer consisting of a polysilicon layer and an upper layer consisting of an amorphous silicon layer. According to this structure, the amorphous silicon layer can be etched to have a surface exhibiting excellent surface roughness since a surface exposed by etching an amorphous material has excellent surface roughness. When the polysilicon layer is etched following the amorphous silicon layer, therefore, the surface of the polysilicon layer exposed by etching can also have excellent surface roughness. Thus, the line width of the gate electrode can be improved in accuracy.

In the aforementioned semiconductor device according to the first aspect, the width of the lower portion of the first silicon layer may be smaller than the width of the upper portion of the first silicon layer.

The aforementioned semiconductor device according to the first aspect preferably further comprises a second silicon layer formed at a prescribed interval from the gate electrode with an upper portion and a lower portion larger in width than a central portion for serving as a wire and a second silicide film formed on the second silicon layer for serving as the wire. According to this structure, it is possible to further increase the distance between the central portions of the wire including the second silicon layer having the upper and lower portions larger in width than the central portion and the gate electrode including the first silicon layer having the upper and lower portions larger in width than the central portion, whereby the capacitance between the wire and the gate electrode can be further reduced.

In this case, the first silicon layer and the second silicon layer preferably consist of the same silicon layer. According to this structure, the first and second silicon layers can be etched through the same etching step, whereby the first silicon layer having the upper and lower portions larger in width than the central portion for serving as the gate electrode and the second silicon layer serving as the wire can be formed at the same time. Consequently, the fabrication process can be simplified.

In the aforementioned semiconductor device having the second silicon layer, the second silicon layer preferably includes a lower layer consisting of a polysilicon layer and an upper layer consisting of an amorphous silicon layer. According to this structure, the amorphous silicon layer can be etched to have a surface exhibiting excellent surface roughness since a surface exposed by etching an amorphous material has excellent surface roughness. When the polysilicon layer is etched following the amorphous silicon layer, therefore, the surface of the polysilicon layer exposed by etching can also have excellent surface roughness. Thus, the line width of the wire can be improved in accuracy.

In the aforementioned semiconductor device having the second silicon layer, the width of the lower portion of the second silicon layer may be smaller than the width of the upper portion of the second silicon layer.

The aforementioned semiconductor device according to the first aspect preferably further comprises a second silicon layer formed at a prescribed interval from the gate electrode with an upper portion and a lower potion larger in width than a central portion for serving as a gate electrode and a second silicide film formed on the second silicon layer for serving as the gate electrode. According to this structure, the distance between the central portions of two electrodes, i.e., the gate electrode including the second silicon layer having the upper and lower portions larger in width than the central portion and the aforementioned gate electrode including the first silicon layer having the upper and lower portions larger in width than the central portion can be further increased, whereby the capacitance between the two gate electrodes can be further reduced.

In this case, the first silicon layer and the second silicon layer preferably consist of the same silicon layer. According to this structure, the first and second silicon layers can be etched through the same etching step, whereby the first and second silicon layers having the upper and lower portions larger in width than the central portions for serving as the gate electrodes can be formed at the same time. Consequently, the fabrication process can be simplified.

A semiconductor device according to a second aspect of the present invention comprises a semiconductor substrate and a gate electrode, consisting of a single metal layer, formed on the semiconductor substrate through a gate insulator film with an upper potion and a lower portion larger in width than a central portion.

In the semiconductor device according to the second aspect, as hereinabove described, the gate electrode consisting of a single metal layer with the upper and lower portions larger in width than the central portion is so formed that the distance between the central portion of the gate electrode and an adjacent wire is increased due to the central portion having a small width, whereby the capacitance between the gate electrode and the wire can be reduced. The gate electrode is formed with the upper and lower portions larger in width than the central portion so that the upper and lower portions of the first silicon layer serve as mask portions when ions are implanted through the gate electrode serving as a mask, whereby a region of the semiconductor substrate located under the gate electrode can be further inhibited from ion implantation of an impurity as compared with a case where only the upper portion of the first silicon layer serves as a mask. Thus, controllability for the ion implantation profile can be improved.

A semiconductor device according to a third aspect of the present invention comprises a first conductive layer formed on a semiconductor substrate with an upper portion and a lower portion larger in width than a central portion and a second conductive layer formed on the semiconductor substrate at a prescribed interval from the first conductive layer with an upper potion and a lower portion larger in width than a central portion.

In the semiconductor device according to the third aspect, as hereinabove described, the first conductive layer and the second conductive layer with the upper and lower portions larger in width than the central portion is so formed at a prescribed interval that the distance between the central portion of the first conductive layer and the central portion of the adjacent second conductive layer is increased due to the central portion having a small width, whereby the capacitance between the first conductive layer and the second conductive layer can be reduced.

In this case, the first conductive layer and the second conductive layer preferably include a silicon layer with an upper potion and a lower portion larger in width than a central portion and a silicide film formed on the silicon layer. According to this structure, the central portion has a smaller width than the upper portion so that the width of the upper portion (upper surface) is prevented from reduction also when the width of the central portion is reduced for reducing the capacitance. Thus, the width of the silicide film formed on the silicon layer can be prevented from reduction, whereby a thin-line effect of the silicide film can be reduced. Consequently, it is possible to inhibit the capacitance from increase while suppressing the thin-line effect of the silicide film.

A method of fabricating a semiconductor device according to a fourth aspect of the present invention comprises steps of forming a first silicon layer on a semiconductor layer through a gate insulator film, forming an etching mask on the first silicon layer, working the first silicon layer to serve as a gate electrode having an upper portion and a lower portion larger in width than a central portion by etching the first silicon layer through the etching mask serving as a mask and forming a first silicide film serving as the gate electrode on the first silicon layer.

In the method of fabricating a semiconductor device according to the fourth aspect, as hereinabove described, the first silicon layer is worked to serve as the gate electrode having the upper portion and the lower portion larger in width than the central portion by etching the first silicon layer so that the distance between the central portion of the gate electrode and an adjacent wire is increased due to the central portion having a small width, whereby the capacitance between the gate electrode and the wire can be reduced. Further, the central portion has a smaller width than the upper portion so that the width of the upper portion (upper surface) is prevented from reduction also when the width of the central portion is reduced for reducing the capacitance. Thus, the width of the first silicide film formed on the first silicon layer can be prevented from reduction, whereby a thin-line effect of the silicide film can be reduced. Consequently, it is possible to inhibit the capacitance from increase while suppressing the thin-line effect of the silicide film. In addition, the gate electrode is formed with the upper and lower portions larger in width than the central portion so that the upper and lower portions of the first silicon layer serve as mask portions when ions are implanted through the gate electrode serving as a mask in a later step, whereby a region of the semiconductor substrate located under the gate electrode can be further inhibited from ion implantation of an impurity as compared with a case where only the upper portion of the first silicon layer serves as a mask. Thus, controllability for the ion implantation profile can be improved.

In the aforementioned method of fabricating a semiconductor device according to the fourth aspect, the step of forming the gate electrode preferably includes a first etching step of dry-etching the first silicon layer in a reverse mesa shape with etching gas containing $Cl_2$, $O_2$ and HBr and a second etching step of dry-etching the first silicon layer in a forward mesa shape with etching gas containing $O_2$ and HBr after the first etching step. According to this structure, the first silicon layer having a reverse mesa upper portion and a forward mesa lower portion can be easily formed.

In the aforementioned method of fabricating a semiconductor device according to the fourth aspect, the first silicon layer preferably includes a lower layer consisting of a polysilicon layer and an upper layer consisting of an amorphous silicon layer. According to this structure, the amorphous silicon layer can be etched to have a surface exhibiting excellent surface roughness since a surface exposed by etching an amorphous material has excellent surface roughness. When the polysilicon layer is etched following the amorphous silicon layer, therefore, the surface of the polysilicon layer exposed by etching can also have excellent surface roughness. Thus, the line width of the gate electrode can be improved in accuracy.

In the aforementioned method of fabricating a semiconductor device according to the fourth aspect, the width of the lower portion of the first silicon layer may be smaller than the width of the upper portion of the first silicon layer.

The aforementioned method of fabricating a semiconductor device according to the fourth aspect preferably further comprises steps of forming a second silicon layer on the semiconductor layer at a prescribed interval from the gate electrode, forming an etching mask on the second silicon layer, working the second silicon layer to serve as a wire or a gate electrode having an upper portion and a lower portion larger in width than a central portion by etching the second silicon layer through the etching mask serving as a mask and forming a second silicide film serving as the wire or the gate electrode on the second silicon layer. According to this structure, it is possible to further increase the distance between the central portions of the wire or the gate electrode including the second silicon layer having the upper and lower portions larger in width than the central portion and the gate electrode including the first silicon layer having the upper and lower portions larger in width than the central portion, whereby the capacitance between the wire and the gate electrode or between the two gate electrodes can be reduced.

In this case, the first silicon layer and the second silicon layer are formed by patterning the same silicon layer. According to this structure, the first and second silicon layers can be patterned by etching through the same etching step, whereby the first and second silicon layers having the upper and lower portions larger in width than the central portions can be formed at the same time. Consequently, the fabrication process can be simplified.

In the aforementioned method of fabricating a semiconductor device including the step of forming the second silicon layer, the second silicon layer preferably includes a lower layer consisting of a polysilicon layer and an upper layer consisting of an amorphous silicon layer. According to this structure, the amorphous silicon layer can be etched to have a surface exhibiting excellent surface roughness since a surface exposed by etching an amorphous material has excellent surface roughness. When the polysilicon layer is etched following the amorphous silicon layer, therefore, the surface of the polysilicon layer exposed by etching can also have excellent surface roughness. Thus, the line width of the wire or the gate electrode can be improved in accuracy.

In the aforementioned method of fabricating a semiconductor device including the step of forming the second silicon layer, the width of the lower portion of the second silicon layer may be smaller than the width of the upper portion of the second silicon layer.

In the aforementioned method of fabricating a semiconductor device including the step of forming the second silicon layer, the width of the lower portion of the second silicon layer may be smaller than the width of the upper portion of the second silicon layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

First, the structure of a semiconductor device according to this embodiment is described with reference to FIG. 1.

Figure 1:
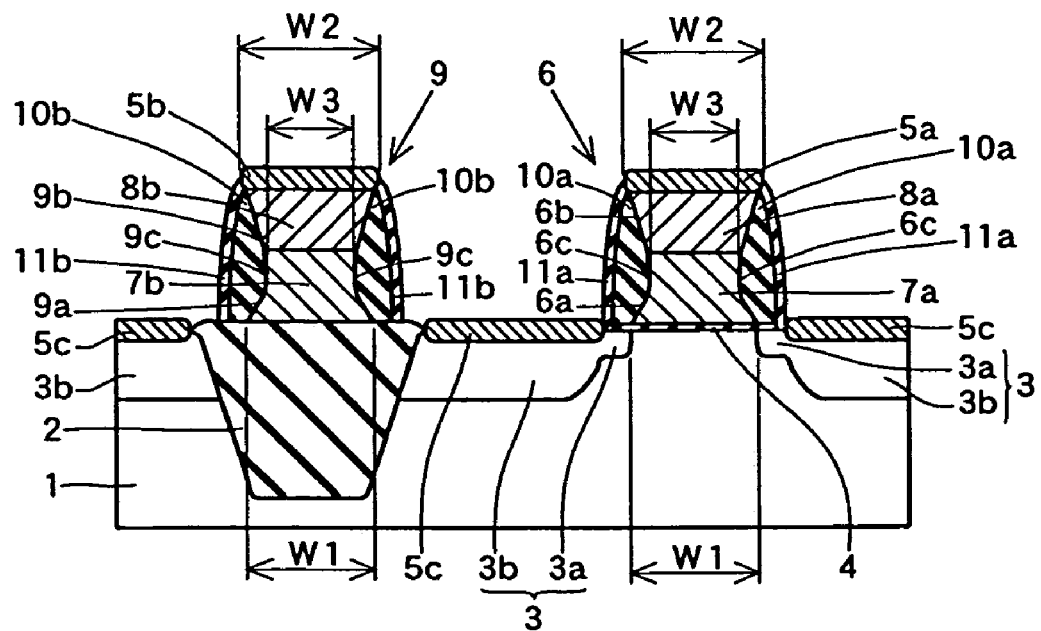
FIG. 1 is a sectional view showing a semiconductor device according to an embodiment of the present invention.

In the semiconductor device according to this embodiment, an element isolation film 2 having an STI (shallow trench isolation) structure for isolating adjacent element forming regions (active regions) from each other is formed on a prescribed region of the main surface of a silicon substrate 1, as shown in FIG. 1. The silicon substrate 1 is an example of the "semiconductor substrate" in the present invention. The upper surface of the element isolation film 2 is formed upward beyond the upper surface of the silicon substrate 1 in a stepped manner. A pair of n-type source/drain regions 3 are formed on an active region of the silicon substrate 1 enclosed with the element isolation film 2 to hold a channel region therebetween. Each of the source/drain regions 3 has an LDD (lightly doped drain) structure consisting of a low-concentration region 3a and a high-concentration region 3b. A gate insulator film 4 of $SiO_2$ having a thickness of about 2 nm is formed on the channel region between the source/drain regions 3. Silicide films 5c of $CoSi_2$ are formed on the high-concentration regions 3b of the source/drain regions 3.

A polysilicon layer 7a doped with phosphorus having a thickness of about 100 nm is formed on the upper surface of the gate insulator film 4. An amorphous silicon layer 8a doped with phosphorus having a thickness of about 100 nm is formed on the polysilicon layer 7a. A silicide film 5a of $CoSi_2$ is formed on the upper surface of the amorphous silicon layer 8a. The polysilicon layer 7a, the amorphous silicon layer 8a and the silicide film 5a constitute a gate electrode 6. The pair of source/drain regions 3, the gate insulator film 4 and the gate electrode 6 constitute an n-channel MOS transistor. The polysilicon layer 7a and the amorphous silicon layer 8a are examples of the "first silicon layer" in the present invention, and the silicide film 5a is an example of the "first silicide film" in the present invention.

According to this embodiment, the gate electrode 6 has a forward mesa lower portion 6a and a reverse mesa upper portion 6b, and includes a neck portion 6c having a width W3 smaller than widths W1 and W2 of the lower portion 6a and the upper portion 6b. The neck portion 6c is an example of the "central portion" in the present invention. The thinnest part of the neck portion 6c is formed on a position of about 70 nm downward from the upper surface of the polysilicon layer 7a. Therefore, the width W1 of the lower portion 6a of the gate electrode 6 is rendered smaller than the width W2 of the upper portion 6b.

Another polysilicon layer 7b doped with phosphorus having a thickness of about 100 nm is formed on the upper surface of the element isolation film 2. Another amorphous silicon layer 8b doped with phosphorus having a thickness of about 100 nm is formed on the polysilicon layer 7b. Another silicide film 5b of $CoSi_2$ is formed on the upper surface of the amorphous silicon layer 8b. The polysilicon layer 7b, the amorphous silicon layer 8b and the silicide film 5b constitute a wire 9. The polysilicon layer 7b and the amorphous silicon layer 8b are examples of the "second silicon layer" in the present invention, and the silicide film 5b is an example of the "second silicide film" in the present invention.

According to this embodiment, the wire 9 has a forward mesa lower portion 9a and a reverse mesa upper portion 9b, and includes a neck portion 9c having a width W3 smaller than widths W1 and 2 of the lower portion 9a and the upper portion 9b. The neck portion 9c is an example of the "central portion" in the present invention. The thinnest part of the neck portion 9c is formed on a position of about 70 nm downward from the upper surface of the polysilicon layer 7b. Therefore, the width W1 of the lower portion 9a of the wire 9 is rendered smaller than the width W2 of the upper portion 9b.

According to this embodiment, the polysilicon layers 7a and 7b constituting the gate electrode 6 and the wire 9 respectively are formed by the same polysilicon layer. Further, the amorphous silicon layers 8a and 8b constituting the gate electrode 6 and the wire 9 respectively are also formed by the same amorphous silicon layer.

First sidewall films 10a and 10b of $SiO_2$ are formed on both side surfaces of the gate electrode 6 and the wire 9 to fill up the neck portions 6c and 9c of the gate electrode 6 and the wire 9 respectively. Second sidewall films 11a and 11b of $Si_3N_4$ having thicknesses of about 30 nm are formed on both side surfaces of the first sidewall films 10a and 10b respectively.

According to this embodiment, as hereinabove described, the gate electrode 6 having the forward mesa lower portion 6a and the reverse mesa upper portion 6b and including the neck portion 6c having the width W3 smaller than the widths W1 and W2 of the lower portion 6a and the upper portion 6b is so formed that the distance between the gate electrode 6 and the adjacent wire 9 is increased due to the neck portion 6c having the small width W3, whereby the capacitance between the gate electrode 6 and the wire 9 can be reduced. Further, the width W2 of the upper portion 6b of the gate electrode 6 is rendered larger than the width W1 of the lower portion 6a so that the width of the silicide film 5a constituting the upper portion 6b of the gate electrode 6 can be prevented from reduction also when the neck portion 6c is formed with the small width W3 for reducing the capacitance, whereby a thin-line effect of the silicide film 5a can be reduced. Consequently, it is possible to inhibit the capacitance from increase while suppressing the thin-line effect of the silicide film 5a. Also when phosphorus is obliquely ion-implanted through masks of the polysilicon layer 7a and the amorphous silicon layer 8a constituting the gate electrode 6, the forward mesa lower portion 6a and the reverse mesa upper portion 6b serve as mask portions so that a region of the silicon substrate 1 located under the gate electrode 6 can be further inhibited from ion implantation of phosphorus as compared with a case where only the reverse mesa upper portion 6b serves as a mask. Thus, controllability for the ion implantation profile can be improved. Further, the distance (channel length) between the source/drain regions 3 can be inhibited from increase, whereby the operating speed is increased.

According to this embodiment, further, the wire 9 including the neck portion 9c having the width W3 smaller than the widths W1 and W2 of the lower portion 9a and the upper portion 9b is formed as hereinabove described so that the distance between the gate electrode 6 and the adjacent wire 9 can be further increased, whereby the capacitance between the gate electrode 6 and the wire 9 can be further reduced. In addition, the width W2 of the upper portion 9b of the wire 9 is rendered larger than the width W1 of the lower portion 9a so that the width of the silicide film 5b constituting the upper portion 9b of the wire 9 can be prevented from reduction also when the neck portion 9c is formed with the small width W3 for reducing the capacitance, whereby a thin-line effect of the silicide film 5b can be reduced.

According to this embodiment, as hereinabove described, the polysilicon layers 7a and 7b constituting the gate electrode 6 and the wire 9 respectively are formed by the same polysilicon layer while the amorphous silicon layers 8a and 8b constituting the gate electrode 6 and the wire 9 respectively are also formed by the same amorphous silicon layer so that the polysilicon layer 7a and the amorphous silicon layer 8a constituting the gate electrode 6 as well as the polysilicon layer 7b and the amorphous silicon layer 8b constituting the wire 9 can be etched through the same etching step. Thus, the gate electrode 6 and the wire 9 can be so simultaneously formed that the fabrication process can be simplified.

According to this embodiment, further, the gate electrode 6 includes the polysilicon layer 7a and the amorphous silicon layer 8a as hereinabove described, whereby the amorphous silicon layer 8a can be etched to have a surface exhibiting excellent surface roughness since a surface of an amorphous material exposed by etching has excellent surface roughness. When the polysilicon layer 7a is etched following the amorphous silicon layer 8a, therefore, the surface of the polysilicon layer 7a exposed by etching can also have excellent surface roughness. Thus, the line width of the gate electrode 6 can be improved in accuracy. Further, the wire 9 also includes the polysilicon layer 7b and the amorphous silicon layer 8b, whereby the line width of the wire 9 can also be improved in accuracy similarly to the gate electrode 6.

A process of fabricating the semiconductor device according to this embodiment is now described with reference to FIGS. 1 to 9.

Figure 2:
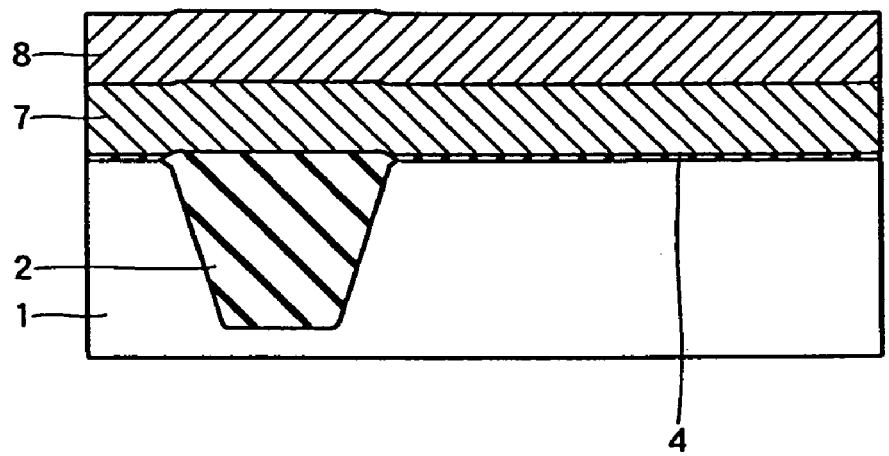
FIGS. 2 to 9 are sectional views for illustrating a process of fabricating the semiconductor device according to the embodiment of the present invention shown in FIG. 1.

First, an element isolation trench is formed on the prescribed region of the main surface of the silicon substrate 1 and the surface thereof is thereafter oxidized, as shown in FIG. 2. The element isolation trench is filled up with an insulator, thereby forming the element isolation film 2 having the STI structure for isolating the active regions from each other. The surface of the silicon substrate 1 is oxidized thereby forming the gate insulator film 4 of $SiO_2$ having the thickness of about 2 nm. The polysilicon layer 7 of about 100 nm in thickness doped with phosphorus by ion implantation and the amorphous silicon layer 8 of about 100 nm in thickness doped with phosphorus by ion implantation are successively formed on the element isolation film 2 and the gate insulator film 4. The polysilicon layer 7 and the amorphous silicon layer 8 are examples of the "silicon layer" in the present invention. Thereafter the phosphorus ions doped into the polysilicon layer 7 and the amorphous silicon layer 8 are activated through RTA (rapid thermal annealing) under a temperature condition of about 1000° C.

Figure 3:
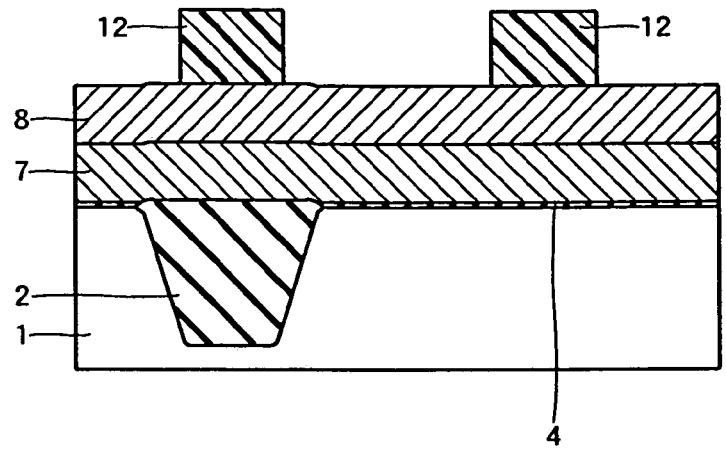

As shown in FIG. 3, etching masks 12 of sulfonium-based resist are formed on prescribed regions of the amorphous silicon layer 8 by lithography.

Figure 4:
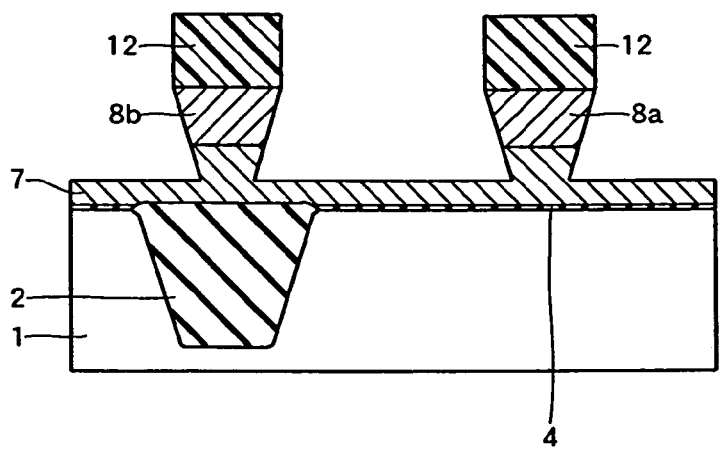

Then, etching is performed through the etching masks 12 so that the etching depth from the upper surface of the amorphous silicon layer 8 is about 170 nm (about 70 nm from the upper surface of the polysilicon layer 7) and a portion between the upper surface of the amorphous silicon layer 8 and an intermediate portion of the polysilicon layer 7 has a reverse mesa shape. This etching is performed in an inductively coupled plasma etching apparatus under conditions of a pressure of about 1.33 Pa, an upper electrode of about 300 W, a lower electrode of about 40 W, a substrate temperature of about 65° C., a numerical aperture of about 50% to about 60% and etching gas of $Cl_2$ (about 20 sccm), $O_2$ (about 1 sccm) and HBr (about 180 sccm). According to this etching, the entirely reverse mesa amorphous silicon layers 8a and 8b are formed while the polysilicon layer 7 presents a reverse mesa shape up to the intermediate portion, as shown in FIG. 4. This etching step is an example of the "first etching step" in the present invention.

The etching conditions are changed to thereafter continue the etching so that the remaining portion of the polysilicon layer 7 presents a forward mesa shape. At this time, the etching is performed in the inductively coupled plasma etching apparatus under conditions of a pressure of about 1.995 Pa, an upper electrode of about 250 W, a lower electrode of about 12 W, a substrate temperature of about 65° C., a numerical aperture of about 50% to about 60% and etching gas of $O_2$ (about 2 sccm) and HBr (about 180 sccm). According to this etching, the polysilicon layer 7 can be easily etched to present the reverse mesa remaining portion. Thereafter the etching masks 12 are removed. This etching step is an example of the "second etching step" in the present invention.

Figure 5:
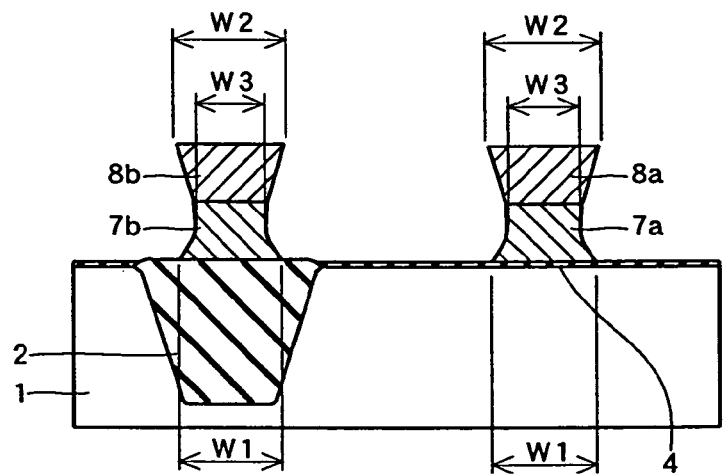

Thus, the polysilicon layer 7a and the amorphous silicon layer 8a constituting the gate electrode 6 are formed on the prescribed region of the gate insulator film 4, as shown in FIG. 5. Further, the polysilicon layer 7b and the amorphous silicon layer 8b constituting the wire 9 having a reverse mesa shape and a forward mesa shape similar to those of the gate electrode 6 are formed on the upper surface of the element isolation film 2. This etching is so performed that the polysilicon layers 7a and 7b present reverse mesa shapes in the portions under the intermediate portions, whereby the polysilicon layers 7a and 7b exhibit the width W1 smaller than the width W2 of the amorphous silicon layers 8a and 8b.

Figure 6:
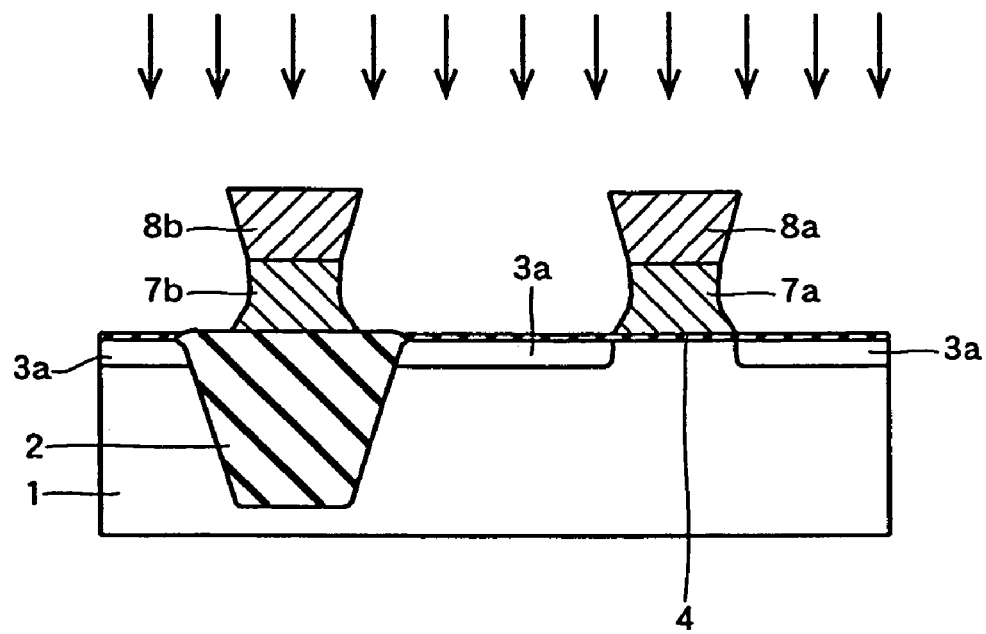

According to this embodiment, phosphorus is ion-implanted into the silicon substrate 1 through the polysilicon layer 7a and the amorphous silicon layer 8a serving as masks thereby forming the low-concentration regions 3a, as shown in FIG. 6. Thus, the region of the silicon substrate 1 located under the polysilicon layer 7a can be inhibited from ion implantation of phosphorus due to the forward mesa lower portion of the polysilicon layer 7a, also when phosphorus is obliquely ion-implanted.

Figure 7:
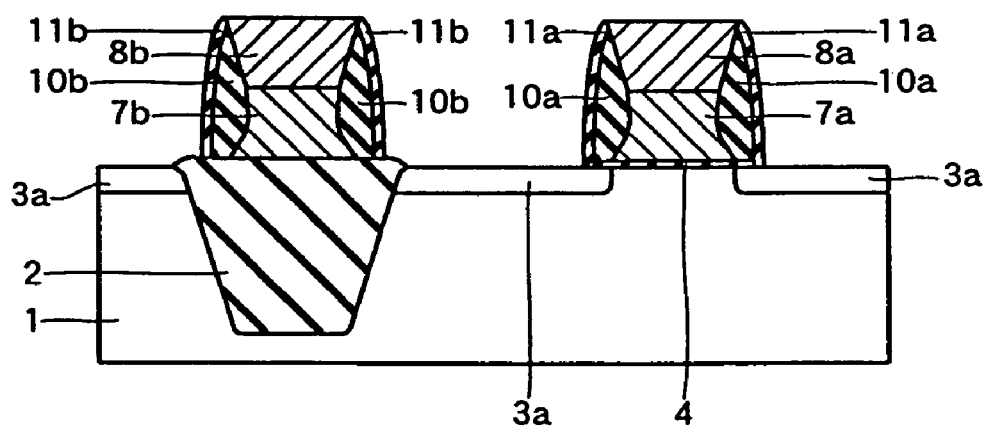

Then, an $SiO_2$ film (not shown) having a thickness of about 200 nm is deposited on the overall surface and thereafter anisotropically etched thereby forming the first sidewall films 10a and 10b of $SiO_2$ on both side surfaces of the polysilicon layers 7a and 7b and the amorphous silicon layers 8a and 8b respectively. Thereafter a silicon nitride film ($Si_3N_4$ film) (not shown) having a thickness of about 150 nm is formed on the overall surface and thereafter anisotropically etched thereby forming the second sidewall films 11a and 11b of $Si_3N_4$ having the thicknesses of about 30 nm on both side surfaces of the first sidewall films 10a and 10b respectively as shown in FIG. 7.

Figure 8:
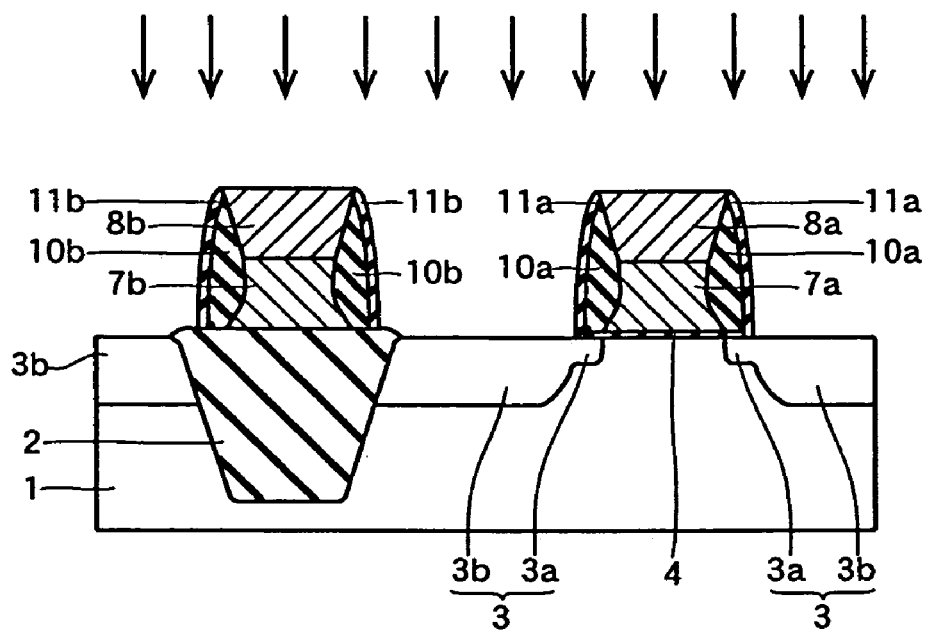

Then, phosphorus is ion-implanted into the silicon substrate 1 through masks of the amorphous silicon layer 8a and the second sidewall films 11a thereby forming the high-concentration regions 3b, as shown in FIG. 8. Thus, the source/drain regions 3a having the LDD structure consisting of the low-concentration regions 3a and the high-concentration regions 3b are formed.

Figure 9:
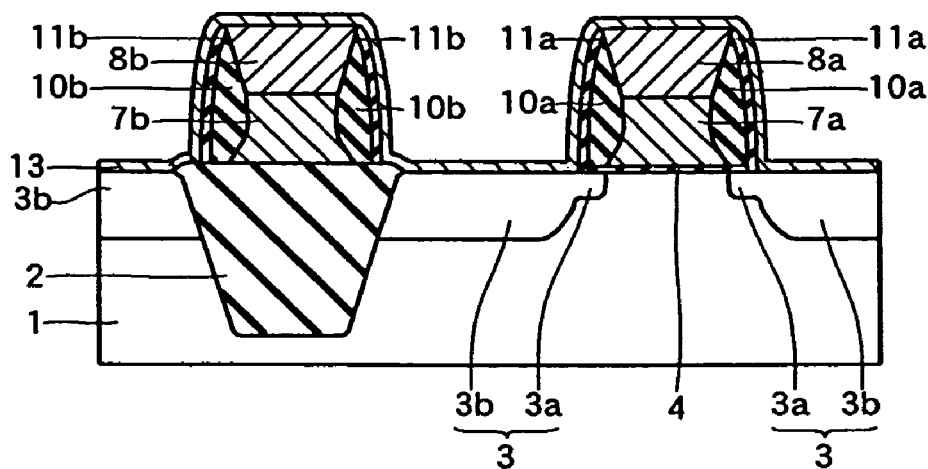

Then, a salicide process is carried out. As shown in FIG. 9, a Co film 13 having a thickness of about 30 nm is formed on the upper surface of the silicon substrate 1, the upper surfaces of the amorphous silicon layers 8a and 8b and both side surfaces of the second sidewall films 11a and 11b by sputtering. RTA is performed under a temperature condition of about 650° C. thereby reacting Si and Co located on the upper surfaces of the amorphous silicon layers 8a and 8b as well as Si and Co located on the upper surface of the silicon substrate 1. Thus, the silicide films 5a and 5b of $CoSi_2$ are formed on the amorphous silicon layers 8a and 8b respectively in a self-aligned manner, while the silicide films 5c of $CoSi_2$ are formed on the high-concentration regions 3b of the source/drain regions 3 in a self-aligned manner. Thereafter the unreacted portions of the Co film 13 are selectively removed. Thus, the gate electrode 6 having the neck portion 6c and including the forward mesa lower portion 6a and the reverse mesa upper portion 6b is formed on the upper surface of the gate insulator film 4, as shown in FIG. 1. Further, the wire 9 having the neck portion 9c and including the forward mesa lower portion 9a and the reverse mesa upper portion 9b is formed on the upper surface of the element isolation film 2. Thus, the semiconductor device including the n-channel MOS transistor is formed according to this embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the silicide films 5a and 5b consist of $CoSi_2$ in the aforementioned embodiment, the present invention is not restricted to this but the silicide films 5a and 5b may alternatively consist of $TiSi_2$, NiSi, WSi or $PtSi_2$, for example.

While the second sidewall films 11a and 11b consist of $Si_3N_4$ in the aforementioned embodiment, the present invention is not restricted to this but the second sidewall films 11a and 11b may alternatively consist of silicon nitride films having a composition, satisfying a general composition formula $Si_xN_y$, other than $Si_3N_4$. Further alternatively, the second sidewall films 11a and 11b may be formed by films consisting of $SiO_2$ or another insulating material. In addition, only the second sidewalls 11a and 11b may be formed without forming the first sidewalls 10a and 10b of $SiO_2$.

While the amorphous silicon layer 8 and the polysilicon layer 7 are etched through the inductively coupled plasma etching apparatus in the aforementioned embodiment, the present invention is not restricted to this but the amorphous silicon layer 8 and the polysilicon layer 7 may alternatively be etched through another plasma dry etching apparatus of an electron cyclotron resonance type, a capacitively coupled two-frequency plasma type or a surface wave plasma type.

Figure 10:
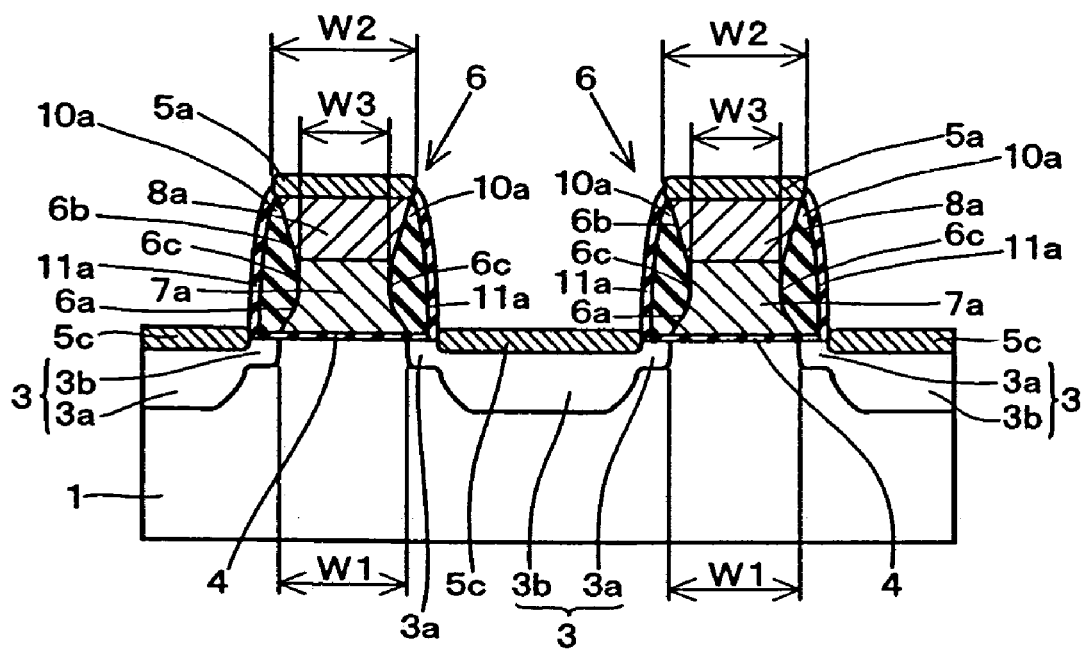
FIG. 10 is a sectional view showing a semiconductor device according to a first modification of the embodiment of the present invention.

While the gate electrode 6 having the forward mesa lower portion 6a and the reverse mesa upper portion 6b and including the neck portion 6c is formed on the upper surface of the gate insulator film 4 while the wire 9 having the forward mesa lower portion 9a and the reverse mesa upper portion 9b and including the neck portion 9c is formed on the upper surface of the element isolation film 2 arranged at a prescribed interval from the gate insulator film 4 in the aforementioned embodiment, the present invention is not restricted to this but another gate electrode 6 may alternatively be formed in place of the wire 9. More specifically, two gate insulator films 4 may be formed on an active region at a prescribed interval and gate electrodes 6 having neck portions 6c and including forward mesa lower portions 6a and reverse mesa upper portions 6b may be formed on the two gate insulator films 4 respectively, as shown in FIG. 10 as a first modification of the embodiment. In this case, a common source/drain region 3 having an LDD structure consisting of a low-concentration region 3a and a high-concentration region 3b is formed between the two gate electrodes 6. Further, two polysilicon layers 7a constituting the two gate electrodes 6 consist of the same layer, while two amorphous silicon layers 8a constituting the two gate electrodes 6 also consist of the same layer.

Figure 11:
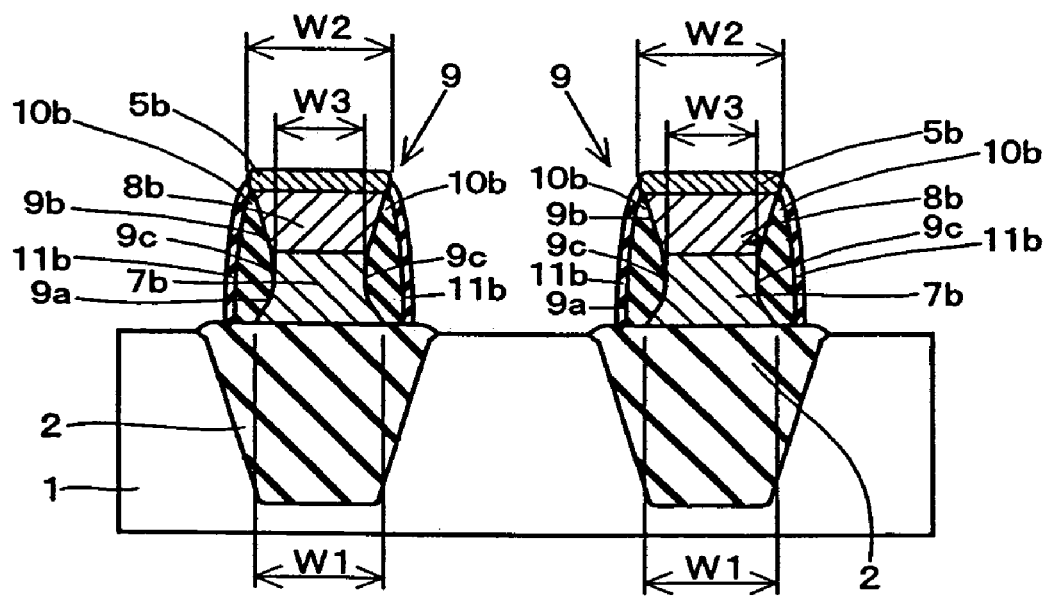
FIG. 11 is a sectional view showing a semiconductor device according to a second modification of the embodiment of the present invention.

While the gate electrode 6 having the forward mesa lower portion 6a and the reverse mesa upper portion 6b and including the neck portion 6c is formed on the upper surface of the gate insulator film 4 while the wire 9 having the forward mesa lower portion 9a and the reverse mesa upper portion 9b and including the neck portion 9c is formed on the upper surface of the element isolation film 2 arranged at a prescribed interval from the gate insulator film 4 in the aforementioned embodiment, the present invention is not restricted to this but another wire 9 may alternatively be formed in place of the gate electrode 6. More specifically, two element isolation films 2 may be formed on an active region at a prescribed interval and wires 9 having neck portions 9c and including forward mesa lower portions 9a and reverse mesa upper portions 9b may be formed on the two element isolation films 2 respectively, as shown in FIG. 11 as a second modification of the embodiment. In this case, two polysilicon layers 7b constituting the two wires 9 consist of the same layer, while two amorphous silicon layers 8b constituting the two wires 9 also consist of the same layer.

Figure 12:
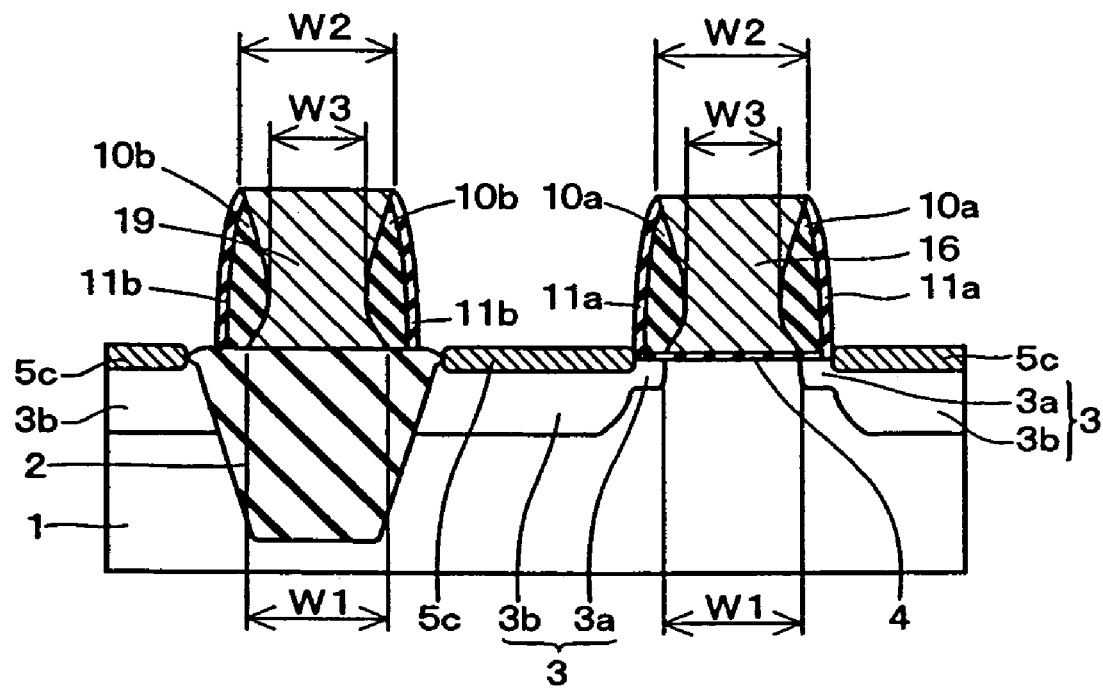
FIG. 12 is a sectional view showing a semiconductor device according to a third modification of the embodiment of the present invention.

While the gate electrode 6 consisting of the polysilicon layer 7a, the amorphous silicon layer 8a and the silicide film 5a is formed on the upper surface of the gate insulator film 4 and the wire 9 consisting of the polysilicon layer 7b, the amorphous silicon layer 8b and the silicide film 5b is formed on the upper surface of the element isolation film 2 arranged at the prescribed interval from the gate insulator film 4 in the aforementioned embodiment, the present invention is not restricted to this but the gate electrode 6 and the wire 9 may alternatively be replaced with a metal gate electrode 16 and a metal wire 19 consisting of single metal layers having identical neck portions, as shown in FIG. 12 as a third modification of the embodiment. The single metal layers constituting the metal gate electrode 16 and the metal wire 19 may conceivably be formed by metal layers of aluminum (Al), titanium (Ti), tungsten (W) or copper (Cu) or oxides or nitrides thereof. Also in this case, the distance between the metal gate electrode 16 and the metal wire 19 can be further increased due to the neck portions, whereby the capacitance between the metal gate electrode 16 and the metal wire 19 can be further reduced.

What is claimed is:

1. A semiconductor device comprising:
   a first silicon layer formed on a semiconductor substrate through a gate insulator film with an upper portion and a lower portion larger in width than a central portion for serving as a gate electrode; and
   a first silicide film formed on said first silicon layer for serving as said gate electrode, wherein
   said first silicon layer serving as said gate electrode includes said upper portion having a reverse mesa shape and said lower portion having a forward mesa shape.

2. The semiconductor device according to claim 1, wherein
   said first silicon layer includes a lower layer consisting of a polysilicon layer and an upper layer consisting of an amorphous silicon layer.

3. The semiconductor device according to claim 1, wherein
   the width of said lower portion of said first silicon layer is smaller than the width of said upper portion of said first silicon layer.

4. The semiconductor device according to claim 1, further comprising:
   a second silicon layer formed at a prescribed interval from said gate electrode with an upper portion and a lower portion larger in width than a central portion for serving as a wire, and
   a second silicide film formed on said second silicon layer for serving as said wire.

5. The semiconductor device according to claim 4, wherein
   said first silicon layer and said second silicon layer consist of the same silicon layer.

6. The semiconductor device according to claim 4, wherein
said second silicon layer includes a lower layer consisting of a polysilicon layer and an upper layer consisting of an amorphous silicon layer.

7. The semiconductor device according to claim 4, wherein
the width of said lower portion of said second silicon layer is smaller than the width of said upper portion of said second silicon layer.

8. The semiconductor device according to claim 1, further comprising:
a second silicon layer formed at a prescribed interval from said gate electrode with an upper portion and a lower potion larger in width than a central portion for serving as a gate electrode, and
a second silicide film formed on said second silicon layer for serving as said gate electrode.

9. The semiconductor device according to claim 8, wherein
said first silicon layer and said second silicon layer consist of the same silicon layer.

10. A semiconductor device comprising:
a semiconductor substrate;
a gate electrode, consisting of a single metal layer, formed on said semiconductor substrate through a gate insulator film with an upper potion and a lower portion larger in width than a central portion, wherein
the gate electrode, consisting of a single metal layer, includes an upper portion having a reverse mesa shape and a lower portion having a forward mesa shape.

11. A semiconductor device comprising:
a first conductive layer formed on a semiconductor substrate with an upper potion and a lower portion larger in width than a central portion; and
a second conductive layer formed on said semiconductor substrate at a prescribed interval from said first conductive layer with an upper potion and a lower portion larger in width than a central portion, wherein
the first conductive layer includes an upper portion having a reverse mesa shape and a lower portion having a forward mesa shape.

12. The semiconductor device according to claim 11, wherein
said first conductive layer and said second conductive layer include:
a silicon layer with an upper potion and a lower portion larger in width than a central portion, and
a silicide film formed on said silicon layer.

13. A semiconductor device comprising:
a first silicon layer formed on a semiconductor substrate through a gate insulator film with an upper portion and a lower portion larger in width than a central portion for serving as a gate electrode; and
a first silicide film formed on said first silicon layer for serving as said gate electrode, wherein
the width of said lower portion of said first silicon layer is smaller than the width of said upper portion of said first silicon layer.

14. A semiconductor device comprising:
a first silicon layer formed on a semiconductor substrate through a gate insulator film with an upper portion and a lower portion larger in width than a central portion for serving as a gate electrode;
a first silicide film formed on said first silicon layer for serving as said gate electrode;
a second silicon layer formed at a prescribed interval from said gate electrode with an upper portion and a lower portion larger in width than a central portion for serving as a wire; and
a second silicide film formed on said second silicon layer for serving as said wire.

15. The semiconductor device according to claim 14, wherein
said first silicon layer and said second silicon layer consist of the same silicon layer.

16. The semiconductor device according to claim 14, wherein
said second silicon layer includes a lower layer consisting of a polysilicon layer and an upper layer consisting of an amorphous silicon layer.

17. The semiconductor device according to claim 14, wherein the width of said lower portion of said second silicon layer is smaller than the width of said upper portion of said second silicon layer.

* * * * *